(12) United States Patent
Ahuja et al.

(10) Patent No.: US 9,116,050 B2
(45) Date of Patent: *Aug. 25, 2015

(54) SENSOR-BASED THERMAL SPECIFICATION ENABLING A REAL-TIME METRIC FOR COMPLIANCE

(75) Inventors: Sandeep Ahuja, University Place, WA (US); Robin A. Steinbrecher, Olympia, WA (US); Susan F. Smith, Olympia, WA (US); David J. Ayers, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 113 days.

This patent is subject to a terminal disclaimer.

(21) Appl. No.: 13/601,333

(22) Filed: Aug. 31, 2012

(65) Prior Publication Data

US 2013/0060399 A1 Mar. 7, 2013

Related U.S. Application Data

(63) Continuation of application No. 12/567,130, filed on Sep. 25, 2009, now Pat. No. 8,260,474.

(51) Int. Cl.
*G01K 3/06* (2006.01)
*H01L 23/34* (2006.01)

(52) U.S. Cl.
CPC ... *G01K 3/06* (2013.01); *H01L 23/34* (2013.01); *H01L 2924/0002* (2013.01)

(58) Field of Classification Search
USPC .................................................. 700/299, 300
See application file for complete search history.

(56) References Cited

U.S. PATENT DOCUMENTS

| 6,630,754 | B1 * | 10/2003 | Pippin ........................... 307/117 |
| 6,893,154 | B2 | 5/2005 | Gold et al. |
| 6,937,958 | B2 | 8/2005 | Gold et al. |
| 7,587,262 | B1 | 9/2009 | Pippin |
| 7,865,750 | B2 | 1/2011 | Singh et al. |
| 7,878,016 | B2 | 2/2011 | Rotem et al. |
| 8,169,764 | B2 * | 5/2012 | Takayanagi et al. .......... 361/103 |
| 8,260,474 | B2 * | 9/2012 | Ahuja et al. .................. 700/300 |
| 2008/0137309 | A1 * | 6/2008 | Barry et al. ................... 361/720 |
| 2009/0099705 | A1 | 4/2009 | Harris |
| 2009/0175065 | A1 * | 7/2009 | Nakao et al. .................. 365/145 |
| 2011/0077794 | A1 | 3/2011 | Ahuja et al. |

OTHER PUBLICATIONS

Non Final Office Action Received for the U.S. Appl. No. 12/567,130, mailed on Dec. 8, 2011, 8 pages.
Notice of Allowance Received for the U.S. Appl. No. 12/567,130, mailed on May 7, 2012, 11 pages.

* cited by examiner

*Primary Examiner* — Sean Shechtman
*Assistant Examiner* — Steven Garland
(74) *Attorney, Agent, or Firm* — Jordan IP Law, LLC

(57) ABSTRACT

An apparatus may include an integrated circuit die having a plurality of temperature sensors and a control unit integrated thereon. The control unit can calculate an average die temperature based on readings from the plurality of temperature sensors, compare the average die temperature to a specification temperature and control an off-die cooling system based on the comparison.

20 Claims, 3 Drawing Sheets

SENSOR-BASED THERMAL SPECIFICATION ENABLING A REAL-TIME METRIC FOR COMPLIANCE

RELATED APPLICATIONS

This application is a continuation of U.S. patent application Ser. No. 12/567,130 filed Sep. 25, 2009, entitled "Sensor-Based Thermal Specification Enabling A Real-Time Metric For Compliance."

BACKGROUND

1. Technical Field

Embodiments generally relate to thermal management in computing system components. More particularly, embodiments relate to the use of sensor-based integrated circuit thermal specifications.

2. Discussion

Currently, processor thermal specifications may be written in terms of case temperature and power dissipation. Neither case temperature nor power dissipation may be available in real-time, however, without the use of additional external sensors or advanced on-die power measurement techniques. In order to verify compliance with the thermal specification, system cooling may therefore need to be characterized for a worst case system configuration. For example, large guardbands might be built into the configuration that could force fan speed algorithms to operate fans at speeds higher than those required to meet the specification. Even though such overcooling of the processor may ensure compliance with the thermal specification, the result could be worse acoustics and higher system fan power consumption.

BRIEF DESCRIPTION OF THE DRAWINGS

The various advantages of the embodiments of the present invention will become apparent to one skilled in the art by reading the following specification and appended claims, and by referencing the following drawings, in which:

DETAILED DESCRIPTION

Embodiments of the present invention provide for a computing system including an integrated circuit die having a plurality of fuses, a plurality of temperature sensors and a power/thermal control unit. The plurality of fuses may define a thermal specification and the power/thermal control unit may calculate an average die temperature based on readings from the plurality of temperature sensors. The power/thermal control unit can also calculate a difference between the average die temperature and the thermal specification, and calculate a time-averaged value of the difference between the average die temperature and the thermal specification. The computing system may also include a thermal management system to use a real-time control signal to adjust a cooling setting of a cooling system based on the time-averaged value.

Embodiments of the present invention also provide for an integrated circuit die having a plurality of temperature sensors and a power/thermal control unit. The power/thermal control unit may calculate an average die temperature based on readings from the plurality of temperature sensors.

Embodiments of the present invention also provide for a method of managing die temperature in which an integrated circuit of a die is used to calculate an average die temperature based on readings from a plurality of sensors integrated onto the die.

Figure 1:
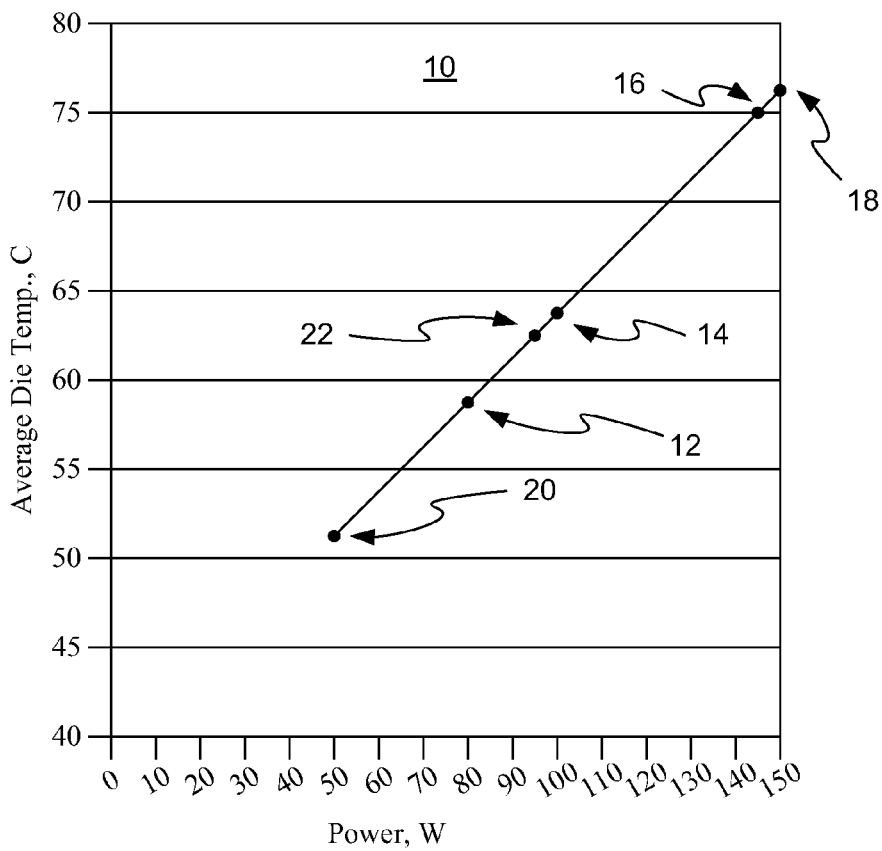
FIG. 1 is a plot of an example of average die temperature as a function of power according to an embodiment.

FIG. 1 shows an example of average die temperature plotted as a function of processor power in a central processing unit (CPU) having eight processor cores. The illustrated plot 10 tracks data from varying powermaps of the eight core configuration. For example, data point 12 corresponds to the average die temperature with one out of eight total cores being active (8C-1A), data point 14 corresponds to the average die temperature with two out of eight total cores being active (8C-2A), and data point 16 corresponds to the average die temperature with four out of eight total cores being active (8C-4A). Data point 18 corresponds to the average die temperature with six out of eight total cores being active (8C-6A), as well as all eight cores being active (8C-8A).

The illustrated plot 10 also includes data point 20, which shows the average die temperature under uniform power heating conditions (i.e., all cores active) at the 50 W power level, and data point 22, which shows the average die temperature under uniform power heating conditions at the 100 W power level. The data point 18 also corresponds to the average die temperature under uniform power heating conditions at the 150 W power level. The power level and temperature values shown herein are used to facilitate discussion only, and other power level and temperature values may apply as appropriate.

The plot 10 clearly demonstrates that the average die temperature is a linear function of CPU power, regardless of whether the power heating conditions are uniform or non-uniform. Accordingly, average die temperature can function as a good metric for thermal specification compliance. An example table of thermal data for the illustrated plot is provided below in Table 1.

TABLE 1

| Cores | Psi_jc C/W | TTV psi_ca C/W | TTV to CPU corr. C/W | Psi_ca C/W | Tc C | Pwr W | Tj | Psi_ja based on Tj C/W | Tj Avg C | Psi_ja based on avg. Tj C/W |
|---|---|---|---|---|---|---|---|---|---|---|
| 8C-8A | 0.100 | 0.21 | −0.013 | 0.197 | 69.6 | 150.0 | 84.6 | 0.297 | 74.7 | 0.231 |
| 8C-6A | 0.140 | 0.21 | −0.010 | 0.200 | 69.9 | 150.0 | 90.9 | 0.339 | 74.8 | 0.232 |

TABLE 1-continued

| Cores | Psi_jc C/W | TTV psi_ca C/W | TTV to CPU corr. C/W | Psi_ca C/W | Tc C | Pwr W | Tj | Psi_ja based on Tj C/W | Tj Avg C | Psi_ja based on avg. Tj C/W |
|---|---|---|---|---|---|---|---|---|---|---|
| 8C-4A | 0.209 | 0.21 | −0.008 | 0.202 | 69.7 | 146.9 | 100.3 | 0.411 | 74.1 | 0.232 |
| 8C-2A | 0.260 | 0.21 | −0.003 | 0.207 | 61.4 | 103.3 | 88.2 | 0.467 | 64.0 | 0.232 |
| 8C-1A | 0.281 | 0.21 | −0.002 | 0.208 | 56.7 | 80.5 | 79.3 | 0.489 | 58.7 | 0.232 |

In Table 1, the local ambient temperature (i.e., average air temperature entering the CPU heatsink) might be 40° C. for all entries, wherein "Psi_jc" is junction-to-case thermal resistance, "TTV psi_ca" is thermal test vehicle (TTV) case-to-local ambient thermal resistance, "TTV to CPU corr." is TTV to CPU case-to-local ambient thermal resistance correction accounting for die size and power distribution differences, "Psi_ca" is case-to-local ambient thermal resistance, "Tc" is case temperature, "Pwr" is power consumption, "Tj" is junction temperature (i.e., the hottest measured temperature on the entire silicon die), "Psi_ja based on Tj" is junction-to-local ambient thermal resistance based on the junction temperature, "Tj Avg" is average junction temperature, and "Psi_ja based on avg Tj" is junction-to-local ambient thermal resistance based on average junction temperature. Table 1 demonstrates that the junction-to-local ambient thermal resistance (Psi_ja) for all CPU configurations (8C-8A, 6C-6A, etc) is only a single value (e.g., 0.23 in the illustrated example) when the average junction temperature is used. By contrast, if one uses the junction temperature, then the junction-to-local ambient thermal resistance would be different for each CPU configuration (8C-8A, 6C-6A, etc.). As CPU core counts increase, then the number of Psi_ja values may also increase, which could in turn increase the number of values to fuse or otherwise store for each processor as well as increase chance of errors. In addition, the hot spot temperature may not be dependent only on the number of active cores but also which cores are active. The illustrated solution may therefore be simpler, less prone to error, and require less CPU stored data.

In the illustrated example, when all cores are not active, the CPU is operated in "turbo mode" so that the CPU is capable of dissipating the full thermal design power (TDP, 150 W in the example shown) even when six cores are active. Such an approach may result in higher spot/junction temperature (Tj), but the illustrated average die temperature is the same for eight-core active and six-core active scenarios. When the CPU power is lower, the average die temperature may scale down based on the total power dissipated in the die. The junction temperature is the hottest, however, for the four-core active scenario. In addition, the case temperature may be weakly dependent on the powermap as indicated by only small changes in the TTV to CPU case-to-local ambient thermal resistance correction (TTV to CPU corr.) column of Table 1. The average die temperature, on the other hand, can be completely independent of the powermap, making it an even better metric for formulating CPU thermal specifications.

Figure 2:
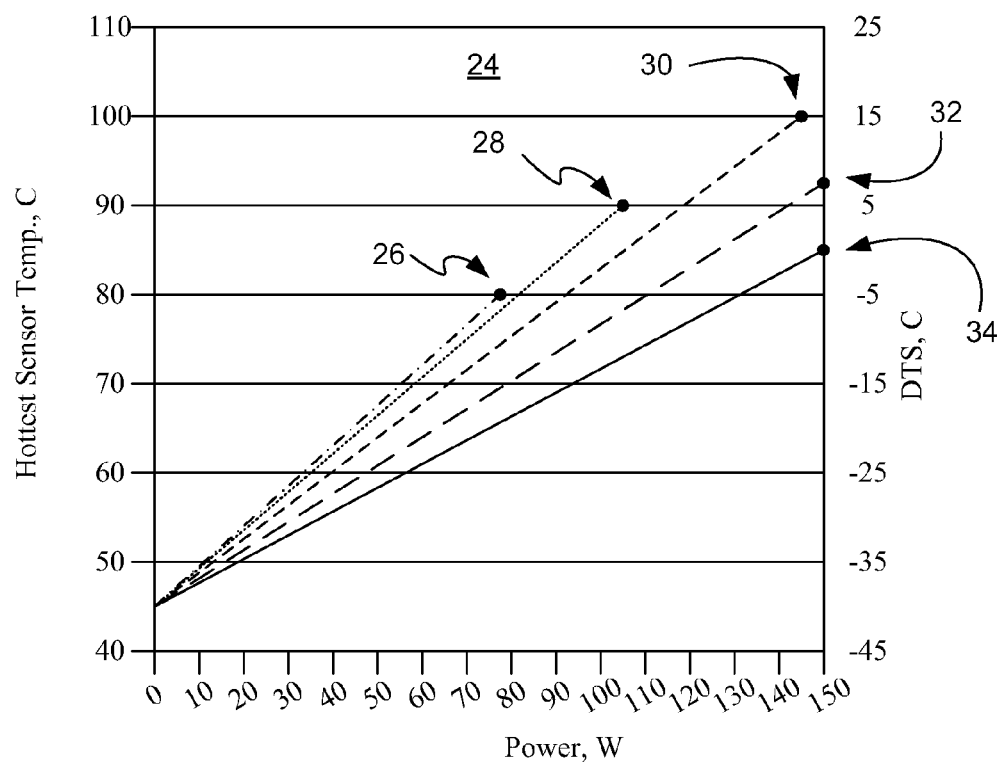
FIG. 2 is a plot of an example of junction temperature as a function of power according to an embodiment.

FIG. 2 shows a plot 24 of the hottest sensor temperature versus power consumption for a powermap that ranges from one to eight active cores. In particular, data point 26 corresponds to the junction temperature when one out of eight cores is active (8C-1A), data point 28 corresponds to the junction temperature when two out of eight cores is active (8C-2A), data point 30 corresponds to the junction temperature when four out of eight cores are active (8C-4C), data point 32 corresponds to the junction temperature when six out of eight cores are active (8C-6A), and data point 34 corresponds to the junction temperature when eight out of eight cores are active (8C-8A). In the illustrated example, the hot spot temperature is not only a function of power but also number of active cores.

Figure 3:
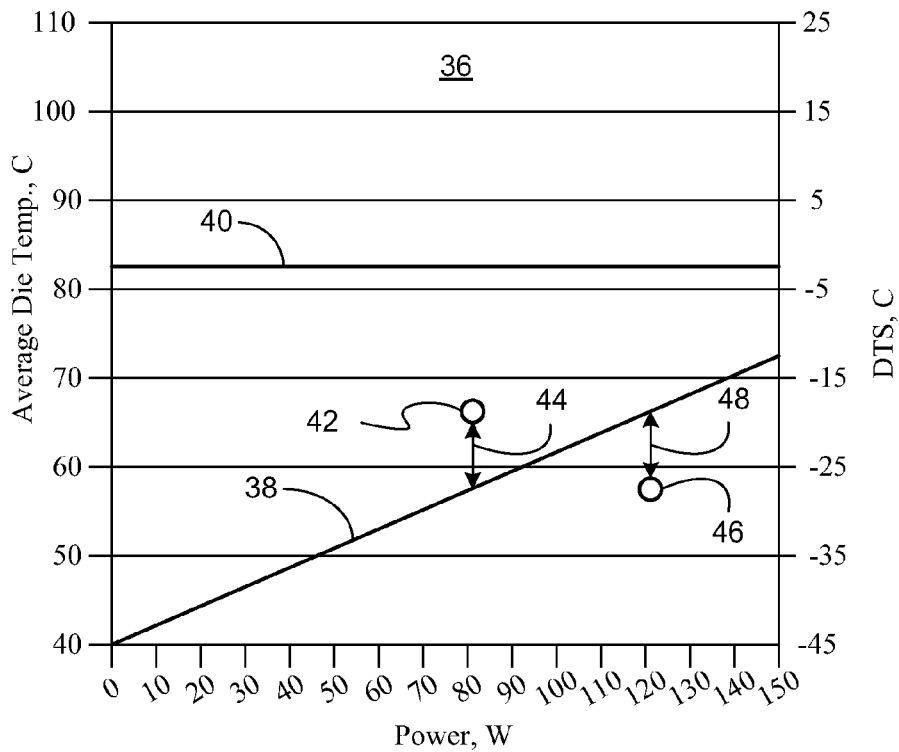
FIG. 3 is a plot of an example of a processor thermal specification structured in terms of average die temperature according to an embodiment.

Turning now to FIG. 3, a graphic representation 36 of a thermal specification is shown. In the illustrated example, an average die temperature curve 38, which is independent of the number of active cores, provides a mechanism for enhanced thermal management. For example, if a certain average die temperature calculation 42 exceeds the thermal specification curve 38 for a particular power level, a gap 44 can be identified and used to generate a real-time control signal to increase a fan speed of an off-die cooling system. By contrast, if another average die temperature calculation 46 is determined to be beneath the thermal specification curve 38, a margin 48 may be identified and a real-time control signal may be generated to decrease the fan speed of the off-die cooling system. The gap 44 or margin 48 may also be time-averaged. Other control signals for on-die and/or off-die components may also be generated. The thermal specification can also use a digital temperature sensor (DTS) value and a hot processor threshold (Tprochot) 40 for thermal management.

Figure 4:
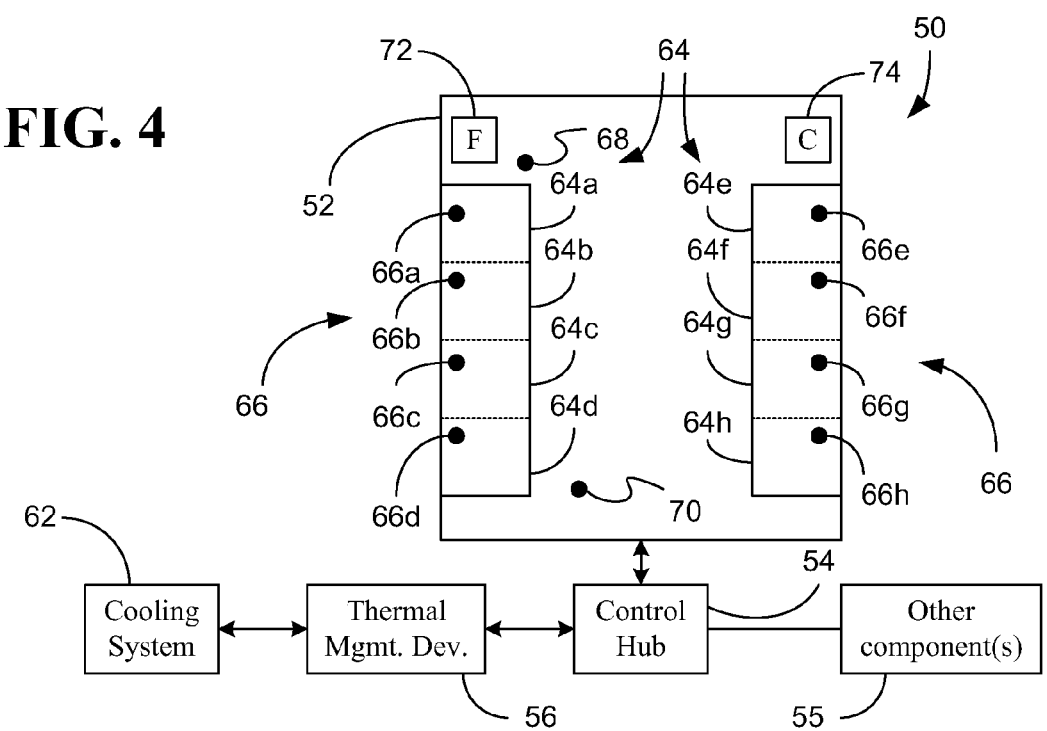
FIG. 4 is a block diagram of a platform according to an embodiment.

FIG. 4 shows a platform 50, which could be a fixed platform such as a personal computer (PC), server, workstation, etc., or a mobile platform such as a laptop, personal digital assistant (PDA), wireless smart phone, media player, imaging device, etc., or any combination thereof. The illustrated platform 50 includes one or more integrated circuit processor dies 52. The platform 50 might also include a control hub 54, thermal management device 56, and a cooling system 62, as well as one or more other components 55 such as radios, graphics/memory/input/output (GMIO) control, memory, peripherals such as hard disk or optical drives, and user interface devices. The illustrated processor die 52 includes integrated circuitry that functions as a host processor and includes a plurality of processor cores 64 (64a-64h), wherein each processor core 64 includes a temperature sensor 66 (66a-66h). The processor die 52 may also include additional temperature sensors 68, 70, which are located outside the core regions.

The die 52 may also include stored data such as a plurality of fuses 72 that define a thermal specification such as the thermal specification curve 38 (FIG. 3) and a power/thermal control unit 74. Other data storage mechanisms, such registers or other non-volatile memory (NVM) structures, may also be used to implement the functionality of the illustrated fuses 72. The illustrated power/thermal control unit 74 calculates an average die temperature based on readings collected from the temperature sensors 66, 68, 70. As will be discussed in greater detail, the average die temperature calculation may be a weighted calculation and can be conducted in a number of different ways. The power/thermal control unit 74 may also calculate the difference between the average die temperature and the thermal specification, and calculate the time-averaged value of the difference between the average die temperature and the specification temperature. The thermal management device 56, which can query the power/thermal control unit 74 for the time-averaged value via the control hub 54, may generate a real-time control signal to adjust a fan speed or other operational setting of the cooling system 62 based on the time-averaged value. In the illustrated example, the processor cores 64, temperature sensors 66, 68, 70, fuses 72 and power/thermal control unit 74 can be integrated onto the integrated circuit processor die 52. In particular, the power/thermal control unit 74 might be written in the assembly language of the integrated circuit on the die 52.

The processor die 52 may be incorporated into a chip/package that is coupled to memory, radio(s), cooling system 62, and user interface devices through the control hub 54. The control hub 54 may include one or more blocks (e.g., chips or units within an integrated circuit) to perform various interface control functions (e.g., memory control, graphics control, I/O interface control, and the like). These circuits may be implemented on one or more separate chips and/or may be partially or wholly implemented within the chip including the processor die 52.

The other components 55 can include memory with one or more memory blocks to provide additional RAM to the processor die 52. It may be implemented with any suitable memory including but not limited to dynamic RAM (DRAM), static RAM (SRAM), flash memory, or the like. The other components 55 can also include radios that may wirelessly couple the processor die 52 to a wireless network (not shown). Additionally, the other components 55 may include user interface devices that may have one or more devices such as a display, keypad, mouse, etc. to allow a user to interact with and perceive information from the platform 50. Moreover, components such as the power/thermal control unit 74, fuses 72, and temperature sensors 66, 68, 70 could also incorporated into the control hub 54, and/or the other components 55 of the platform such as memory, hard disk or optical drives, or radios, to further improve thermal specification compliance, cooling and acoustics.

As already noted, the platform 50 may implement a variety of different computing devices or other appliances with computing capability. Such devices include but are not limited to laptop computers, notebook computers, PDAs, cellular phones, audio and/or video media players, desktop computer, servers, and the like. The platform 50 could constitute one or more complete computing systems or alternatively, it could constitute one or more components useful within a computing system.

Figure 5:
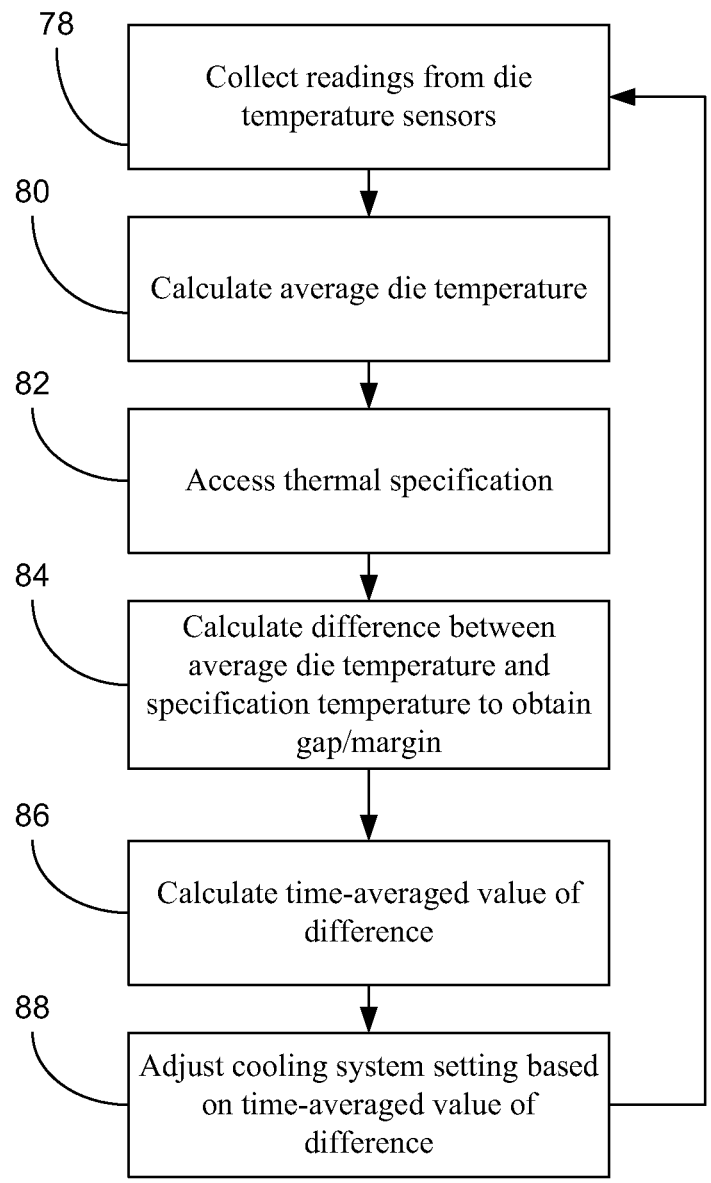
FIG. 5 is a flowchart of an example of a method of managing die temperature according to an embodiment.

Turning now to FIG. 5, a method 76 of managing die temperature is shown. The method 76 may be implemented as a power/thermal control unit in fixed-functionality hardware using assembly language programming and circuit technology such as application specific integrated circuit (ASIC), complementary metal oxide semiconductor (CMOS) or transistor-transistor logic (TTL) technology, in executable software as a set of logic instructions stored in a machine- or computer-readable medium of a memory such as random access memory (RAM), read only memory (ROM), programmable ROM (PROM), flash memory, etc., or any combination thereof. For example, computer program code to carry out operations shown in method 76 may be written in any combination of one or more programming assembly languages, including a precompiled code (p-code) language and incorporated into a processor core or other active region of an integrated circuit.

In the illustrated example, processing block 78 provides for collecting readings from a plurality of die temperature sensors. The average die temperature can be calculated at block 80. A number of approaches may be used to conduct the calculation of block 80. For example, one approach might be to apply weights to the individual readings based on the locations of individual temperature sensors relative to the footprint of one or more processor cores contained on the die. Such an approach could be represented by the following average die temperature equation:

$$\overline{T}_{javg} = \overline{T}_{s1-8} \times \alpha \frac{Area_{cores}}{Area_{die}} + \overline{T}_{s9-10} \times \left(1 - \alpha \frac{Area_{cores}}{Area_{die}}\right)$$

Where the subscripts 1-8 correspond to the temperature sensors 66 (FIG. 4) that are located in core regions, and the subscripts 9-10 correspond to the temperature sensors 68, 70 (FIG. 4) that are located outside core regions. Weighting could be derived in other ways such as, for example, based on other mathematical methods as well such as least sum of squares, etc.

In another example, the activity in the CPU may be used to determine the area weighting. If some of the cores are idle, they may become a better representation of what is happening outside the active core region and can be combined with the second term on the right hand side of the above:

$$Area_{active-cores} = \frac{\text{\# of Active Cores}}{\text{Total \# cores}} \times Area_{cores}$$

$$\overline{T}_{javg} = \overline{T}_{s\_active-cores} \times \alpha \frac{Area_{active-cores}}{Area_{die}} +$$
$$\overline{T}_{s\_inactive\_cores,9-10} \times \left(1 - \alpha \frac{Area_{active-cores}}{Area_{die}}\right)$$

Thus, weights could be applied to the readings based on locations of individual temperature sensors relative to the footprint of active processor cores. The above equations utilize area based weights for the sensor temperature. The error in average die temperature can be further minimized by determining a parameter α based on a set of powermaps. Use of α can shift the area weighting further towards the temperature of active cores (α>1), or the temperature of inactive cores (α<1).

$$\overline{T}_{javg} = \overline{T}_{s\_active-cores} \times \alpha \frac{Area_{active-cores}}{Area_{die}} +$$
$$\overline{T}_{s\_inactive\_cores,9-10} \times \left(1 - \alpha \frac{Area_{active-cores}}{Area_{die}}\right)$$

Processing block 82 provides for accessing a thermal specification. The thermal specification could be defined by a plurality of fuses integrated onto the die so that a specification temperature can be calculated from the plurality of fuses based on the power level of the die. The difference between the average die temperature and the specification temperature may be calculated at block 84 to obtain a gap or margin as already discussed. Block 86 provides for calculating a time-averaged value of the difference between the average die temperature and the thermal specification (e.g., gap/margin), and a real-time cooling control signal can be generated at block 88 based on the time-averaged value.

Thus, techniques described herein may be used to save power at the wall socket by reducing fan power. For example, fans and other cooling mechanisms may consume just enough power to ensure specification compliance of the CPU or chipset. Expected fan savings under thermal design power (TDP) can be significant for a platform such as a rack server. Acoustics savings at TDP might also be on the order of the relative noise between one and five systems.

In addition, techniques described herein could also enable significant cost reductions for complex systems such as datacenters, which scale with power. For example, the illustrated thermal specification may result in power savings over the entire range of power values and can provide the maximum benefit under TDP workloads, resulting in both capital cost savings and operating cost savings.

Embodiments of the present invention are applicable for use with all types of semiconductor integrated circuit ("IC") chips. Examples of these IC chips include but are not limited to processors, controllers, chipset components, programmable logic arrays (PLA), memory chips, network chips, and the like. In addition, in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments of the present invention are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments of the invention. Further, arrangements may be shown in block diagram form in order to avoid obscuring embodiments of the invention, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments of the invention, it should be apparent to one skilled in the art that embodiments of the invention can be practiced without, or with variation of, these specific details. The description is thus to be regarded as illustrative instead of limiting.

The term "coupled" is used herein to refer to any type of relationship, direct or indirect, between the components in question, and may apply to electrical, mechanical, fluid, optical, electromagnetic, electromechanical or other connections. In addition, the terms "first", "second", etc. are used herein only to facilitate discussion, and carry no particular temporal or chronological significance unless otherwise indicated.

Those skilled in the art will appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

We claim:

1. A computing system comprising:
   an integrated circuit die including a non-volatile memory (NVM) structure, a plurality of temperature sensors and a control unit integrated onto the die, the NVM structure defining a thermal specification and the control unit calculating an average die temperature based on readings from the plurality of temperature sensors, calculating a difference between the average die temperature and a specification temperature, and calculating a value of the difference between the average die temperature and the specification temperature; and
   a thermal management system using a real-time control signal to adjust a cooling setting of a cooling system based on the value,
   wherein the thermal specification includes a thermal specification curve and the cooling setting is adjusted based on a position of the value with respect to the thermal specification curve.

2. The computing system of claim 1, wherein the control unit further calculates the specification temperature from the NVM structure based on a power level of the die.

3. The computing system of claim 1, wherein the control unit applies weights to the readings.

4. The computing system of claim 3, wherein the die further includes a processor core, the control unit applying the weights based on locations of individual temperature sensors relative to a footprint of the processor core.

5. The computing system of claim 3, wherein the die further includes a plurality of processor cores, the control unit applying the weights based on locations of individual temperature sensors relative to a footprint of active processor cores.

6. An integrated circuit die comprising:
   a plurality of temperature sensors;
   a control unit, the control unit calculating an average die temperature based on readings from the plurality of temperature sensors; and
   a non-volatile memory (NVM) structure defining a thermal specification, the control unit further calculating a difference between the average die temperature and a specification temperature, wherein the control unit further calculating a value of the difference between the average die temperature and the specification temperature,
   wherein the thermal specification includes a thermal specification curve and a cooling setting is adjusted based on a position of the value with respect to the thermal specification curve.

7. The integrated circuit die of claim 6, wherein the control unit further generates a real-time cooling system control signal based on the value.

8. The integrated circuit die of claim 7, wherein the control unit applies weights to the readings.

9. The integrated circuit die of claim 8, wherein the die further includes a processor core, the control unit applying the weights based on locations of individual temperature sensors relative to a footprint of the processor core.

10. The integrated circuit die of claim 8, further including a plurality of processor cores, the control unit applying the weights based on locations of individual temperature sensors relative to a footprint of active processor cores.

11. The integrated circuit die of claim 6, wherein the control unit further calculates the specification temperature from the NVM structure based on a power level of the die.

12. A method comprising:
using an integrated circuit of a die to calculate an average die temperature based on readings from a plurality of temperature sensors integrated onto the die; and
calculating a difference between the average die temperature and a thermal specification temperature defined using a non-volatile memory (NVM) structure integrated onto the die, wherein the thermal specification includes a thermal specification curve.

13. The method of claim 12, further comprising:
calculating a value of the difference between the average die temperature and the thermal specification temperature; and
generating a real-time cooling system control signal based on the value, wherein a cooling setting is generated based on a position of the value with respect to the thermal specification curve.

14. The method of claim 12, further including applying weights to the readings.

15. The method of claim 14, further including applying the weights based on locations of individual temperature sensors relative to a footprint of a processor core that is integrated onto the die.

16. The method of claim 14, further including applying the weights based on locations of individual temperature sensors relative to a footprint of active processor cores that are integrated onto the die.

17. A non-transitory computer readable storage medium comprising a set of embedded controller firmware instructions which, when executed by an embedded controller that is integrated into a computing platform, cause the embedded controller to implement a method of:
using an integrated circuit of a die to calculate an average die temperature based on readings from a plurality of temperature sensors integrated onto the die; and
calculating a difference between the average die temperature and a thermal specification temperature defined using a non-volatile memory (NVM) structure integrated onto the die, wherein the thermal specification includes a thermal specification curve.

18. The medium of claim 17, further comprising wherein the firmware instructions, when executed, cause the embedded controller to:
calculate a value of the difference between the average die temperature and the thermal specification temperature; and
generate a real-time cooling system control signal based on the value, wherein a cooling setting is generated based on a position of the value with respect to the thermal specification curve.

19. The medium of claim 17, further comprising wherein the firmware instructions, when executed, cause the embedded controller to apply weights to the readings.

20. The medium of claim 19, further comprising wherein the firmware instructions, when executed, cause the embedded controller to apply the weights based on locations of individual temperature sensors relative to:
a footprint of a processor core that is integrated onto the die; or
a footprint of active processor cores that are integrated onto the die.

* * * * *